ns patent [19]

Cortellino

[11] 3,987,215
[45] Oct. 19, 1976

[54] RESIST MASK FORMATION PROCESS
[75] Inventor: Charles A. Cortellino, Wappingers Falls, N.Y.
[73] Assignee: International Business Machines Corporation, Armonk, N.Y.
[22] Filed: Apr. 22, 1974
[21] Appl. No.: 462,688

[52] U.S. Cl................................. 427/43; 427/273; 96/35.1; 96/36.2; 96/48 R; 96/115 R; 204/159.14
[51] Int. Cl.$^2$.......................................... B05D 3/06
[58] Field of Search..................... 117/8, 11, 93.31; 96/35.1, 36.2, 115 R, 48 R; 427/43, 273

[56] References Cited
UNITED STATES PATENTS

| | | | |
|---|---|---|---|
| 2,670,286 | 2/1954 | Minsk et al. | 96/35.1 |
| 2,670,287 | 2/1954 | Minsk et al. | 96/35.1 |
| 2,892,712 | 6/1959 | Plambeck, Jr. | 96/35.1 |
| 3,535,137 | 10/1970 | Haller et al. | 117/8 |
| 3,679,497 | 7/1972 | Handy et al. | 156/2 |
| 3,779,806 | 12/1973 | Gipstein et al. | 117/8 X |

FOREIGN PATENTS OR APPLICATIONS

| | | | |
|---|---|---|---|
| 1,168,445 | 10/1969 | United Kingdom | 96/115 R |

OTHER PUBLICATIONS

Haller et al., "High–Resolution Positive Resists for Electron–Beam Exposure," IBM Journal, May 1968, pp. 251–252.

*Primary Examiner*—Ronald H. Smith
*Assistant Examiner*—Evan K. Lawrence
*Attorney, Agent, or Firm*—David M. Bunnell

[57] ABSTRACT

A resist mask is formed by coating on a substrate a layer of a polymer, such as polymethyl methacrylate, which is degradable by high energy radiation, such as a scanning electron beam. The layer is exposed to high energy radiation in a patternwise manner so as to lower the molecular weight of the polymer in the exposed portions. The layer is developed to remove the exposed portions by immersing the layer in a developer which consists of alkyl acetates and ketones having between 7 and 9 carbon atoms and mixtures thereof at a temperature of at least about 40° C.

5 Claims, No Drawings

RESIST MASK FORMATION PROCESS

BACKGROUND OF THE INVENTION

This invention relates generally to the preparation of resist masks and more particularly to a development process for radiation exposed position resist layers.

The formation of positive resist masks from layers of radiation degradable polymers is described, for example, by Haller and Hatzakis in U.S. Pat. Nos. 3,535,137. In this process, a radiation degradable polymer layer is coated on a substrate and is subjected to patternwise exposure to high energy radiation such as, for example, x-rays, nuclear radiation, or electrons. The irradiated regions of the polymer suffer a decrease in molecular weight and thereby become more rapidly soluble. A developer is then used to remove the irradiated portions of the layer. The substrate is then subjected to an additive or subtractive process such as metallization or etching with the remaining portions of the resist layer acting to protect the substrate from the processing. Where the exposure is made with a focused scanning electron beam, the exposure step is a lengthy process with the time required being largely dependent upon the exposure energy which is needed to permit a satisfactory pattern to be developed. It is desirable to find ways of speeding up the process either by finding faster or more sensitive resist materials or by improving the development techniques.

BRIEF SUMMARY OF THE INVENTION

A process has now been found which permits the development of resist images at low exposure energies and increased overall speed.

In accordance with this invention there is provided a process for forming a resist mask comprising coating on a substrate a layer of a polymer which is degradable by high energy radiation. The layer is exposed patternwise to high energy radiation so as to lower the molecular weight of the polymer in the exposed portions. The layer is developed to remove the exposed portion by treating the layer with an organic liquid developer at temperatures of at least about 40° C.

DETAILED DESCRIPTION

The foregoing and other objects, features and advantages of the invention will be apparent from the following more particular description of preferred embodiments of the invention.

Resist mask formation processes using high energy radiation for the exposure such as x-ray nuclear radiation, electron beam, etc., to degrade radiation sensitive polymers such as polymethyl methacrylate have been used in the manufacture of integrated circuits to achieve patterns having high resolution. A preferred method of exposure is by employing a focused electron beam having an energy of from about 3 to 50 KV at exposure times which provide dosages of from about 3 to 30 microcoulombs per square centimeter, depending upon the sensitivity of the particular resist structure employed. In such exposure processes using scanning beams as opposed to exposure through patterned masks, advantages are obtained in that the patterns can be easily varied under computer control to produce a variety of different patterns. Using patterned masks, on the other hand, requires the generation of a different mask for each pattern desired which is expensive and requires relatively long lead times.

One limitation on the use of scanning beams is the time required to expose each photosensitive layer because the exposure takes place sequentially rather than simultaneously. The development of a patterned layer depends upon the creation by the exposure of sufficient solubility rate differences between the exposed and the unexposed portions to permit a relief pattern to be developed. Methods of enhancing this difference for a given amount of exposure energy permit the exposure times to be reduced. This is of importance in achieving a practical process.

Resist materials suitable for use in the high energy radiation exposure resist mask formation process of the invention are those which are degraded under high energy radiation at dosage levels above about $1 \times 10^{-6}$ coulombs per square centimeter. Suitable polymers are described, for example, in U.S. Pat. No. 3,535, 137. Such resists include vinyl type polymers such as those derived, for example, from the lower alkyl esters of methacrylic acid, wherein the alkyl group contains 1 to 4 carbon atoms, such as methyl methacrylate, n-butyl methacrylate and t-butyl methacrylate.

The measure of the speed of a photoresist formation process can be expressed as the "sensitivity" of the resist which is defined as the ratio of $S/S_o$, where S is the solubility rate of exposed resist for a given exposure dosage and $S_o$ is the solubility rate for the unexposed resist. The rates are usually expressed in angstroms per minute.

Large ratios of $S/S_o$ permit the resist layer to be developed with acceptable loss in unexposed resist layer. If the ratios are low, then the remaining resist layer thickness becomes so thin that pin holes in the resist layer become a problem and/or the remaining layer thickness is not sufficient for carrying out processes such as metal lift-off. Generally an $S/S_o$ ratio of at least about 2.0 is required for most processes so that a sufficient unexposed resist layer thickness remains after development. Even if the ratio is acceptable from the above process standpoints, the total development time, or the time needed to completely remove the exposed portions of the layer, must be kept within reasonable bounds of a matter of minutes rather than hours.

The present invention is directed to the improvement of overall process speeds by enabling the exposure energy and total development time to be reduced by using an improved development step.

The development step according to the invention is carried out at elevated temperatures of about 40° C and above using developers which are either too slow or inoperative at ambient temperatures of, for example, about 20° to 25° C. The use of such developers at high temperatures surprisingly provides not only fast development times but also gives high $S/S_o$ ratios for a given exposure energy. The overall process speed for a given resist can thereby be significantly enhanced.

The developers which are useful in the process of the invention are organic liquids which heretofore have been disregarded as being either too slow or non-solvents for resist layers under the usual room temperature development conditions. Such solvents include alkyl acetates and ketones which have seven to nine carbon atoms in the molecule. Advantageously, the developers comprise binary mixtures which include one component which is a good solvent for the resist at the development temperature employed and a second component which is a poor solvent for the resist at the development temperature. Examples of good solvents would be isoamyl acetate and 3-heptanone. An example of a poor solvent component is n-hexyl acetate. An example of a single component developer, which is preferred for relatively high molecular weight resists such as polymethyl methacrylate having molecular weights of about 750,000 $M_w$ (where $M_w$ is weight average molecular weight) or higher is 3-octanone. It is preferred that polymer layers having a $M_w$ of at least about 100,000 be used in the process of the invention in order to achieve satisfactory sensitivity.

The invention is further illustrated but is not intended to be limited to the following examples wherein parts are parts by weight unless otherwise indicated:

EXAMPLE 1

An approximately 7,000 angstroms thick film of polymethyl methacrylate having a molecular weight, $M_w$, of about 400,000 was spun from an 8% by weight solution of the polymer in chlorobenzene onto the surface of silicon wafers which had a surface layer of about 5,000 angstroms of silicon dioxide. The wafers were exposed using a scanning electron beam about 50 mils square at an energy of 25 KV and a dosage of about $18 \times 10^{-6}$ coulombs per square centimeter. The pattern was a resolution pattern having directional lines 100 micro inches wide with 100 micro inch spaces. Two wafers were developed in a binary developer of 3 parts by volume of isoamyl acetate to 8 parts by volume of n-hexyl acetate at a temperature of 44.3° C with a development time required of 7 minutes. Two wafers were developed using a binary developer containing one part by volume of 3-heptanone to 4 parts by volume of n-hexyl acetate at a temperature of 40.1° C with a required development time of 11 minutes. The resist thickness on each wafer was measured following the post bake of the developed resist at a temperature of about 130° C for 30 minutes. The ratio of S over $S_o$ was determined for each set of wafers as being respectively 14.6 and 11.7. Prior development processes using room temperature development and methyl isobutyl ketone developer take longer and produce $S/S_o$ ratios of from about 1.5 to about 3 under similar exposure conditions.

EXAMPLE 2

Sample wafers were prepared as in Example 1 with a coating of polymethylmethacrylate ($M_w$= 400,000) to obtain an approximate dry film thickness of 7,000 angstroms. The layers were prebaked for 30 minutes at 160° C and then exposed with the scanning electron beam at 15 KV to an exposure energy of $6 \times 10^{-6}$ coulombs per square centimeter on each pass of the scanning beam with up to 5 passes being employed. A wafer which had received 5 passes was developed with isoamyl acetate alone at 25° C and the loss of unexposed resist thickness and the rate of development of the exposed resist were determined. The development time was 270 minutes, the original resist thickness of unexposed resist decreased from 7080 angstroms to 6600 angstroms. The exposed development rate was 26.2 angstroms per minute with a calculated $S/S_o$ of about 15. A second wafer which had received 5 passes was developed with isoamyl acetate alone at a temperature of 40.5° C. The unexposed resist layer went from a thickness of 7500 angstroms to 5923 angstroms with an exposed film development rate determined to be about 750 angstroms per minute and a calculated $S/S_o$ of about 4.7 with a development time of 10 minutes. A second sample which had a single pass exposure took 20 minutes to develop with isoamyl acetate of 40.5° C with a loss of unexposed resist thickness from 7500 to 4320 angstroms with a development rate of 375 angstroms per minute for the exposed layer and a calculated $S/S_o$ of about 1.75. Another wafer was developed using a preferred process of the invention with a developer containing 1 part by volume isoamyl acetate and 4 parts by volume n-hexyl acetate at a temperature of about 51° C. The resist layer had received a 1 pass exposure by the electron beam. The unexposed resist thickness went from 7080 angstroms to 6880 angstroms during the development time of 15 minutes with an exposed film development rate of 471 angstroms per minute to give a calculated $S/S_o$ of about 40. This last figure is somewhat high in view of the difficulty in accurately measuring the small loss in resist thickness.

The example illustrates the advantage of including a poor solvent, n-hexyl acetate, in the high temperature development process in order to maintain sensitivity at minimum exposure energies while obtaining the desired development speed. It also illustrates the poor solvent properties of isoamyl acetate with room temperature development.

EXAMPLE 3

This example illustrates the effect of molecular weight on the sensitivity ratio which can be obtained by the process of the invention.

Oxidized silicon wafers similar to those used in Example 1 were coated with different ratios of two polymethacrylate resists. The Resist A had a molecular weight, $M_w$, of about 400,000 and Resist B had a lower molecular weight, $M_w$, of about 80,000. Coatings of about 7,000 angstroms were provided from chlorobenzene solutions of the polymer with the coatings being prebaked for 1 hour at 160° C and then exposed to a 25 KV scanning electron beam at an energy of $10.8 \times 10^{-6}$ coulombs per square centimeter. The samples were developed in a developer which was 1 part by volume 3-heptanone to 4 parts by volume n-hexyl acetate at about 40° C. The $S/S_o$ ratios were determined after post baking the developed resist layers for 30 minutes at 130° C. The results are shown in Table I below:

Table I

| Parts of Resist A | Parts of Resist B | Data S(3) | Calc. (1) S | Data $S_o$(4) | Calc. (2) $S_o$ | Data $S/S_o$ | Calc. $S/S_o$ |
|---|---|---|---|---|---|---|---|
| 100 | 0 | 575 | 575 | 75 | 92 | 7.7 | 6.25 |
| 80 | 20 | 823 | 815.5 | 160 | 174 | 5.1 | 4.70 |
| 60 | 40 | 867 | 1156.7 | 367 | 328 | 2.4 | 3.553 |
| 40 | 60 | 1520 | 1640.5 | 647 | 618 | 2.3 | 2.65 |
| 20 | 80 | 2373 | 2326.7 | 1190 | 1166 | 2.0 | 2.00 |

Table I-continued

| Parts of Resist A | Parts of Resist B | Data | Calc. (1) | Data | Calc. (2) | Data | Calc. |
|---|---|---|---|---|---|---|---|
| 0 | 100 | 4600 | 3300 | 2020 | 2200 | 2.3 | 1.50 |

(1) log S = 3.51851 − 0.0075884 × Parts A
(2) log $S_o$= 3.34242 − 0.0137863 × Parts A
(Calculated data equations are straight lines on semi-log paper drawn through data points. They express data trend and smooth out data and experimental errors).
(3) where S is the solubility rate of exposed resist layer in angstroms per minute.
(4) where $S_o$ is the solubility rate of unexposed resist layer in angstroms per minute.

As it can be seen from the results of Table I, the development process becomes more advantageous as the average molecular weight of the polymer increases because the sensitivity ratios decrease as the average molecular weight of the resist layer decreases.

EXAMPLE 4

Oxidized silicon wafers were coated with an 8000-angstrom thick layer of polymethyl methacrylate having an $M_w$ of about 1,000,000 and exposed patternwise to a dosage of $9.3 \times 10^{-6}$ coulombs per square centimeter. Development was with 3-octanone at 45° C for 12.5 minutes. The ratio of $S/S_o$ was found to be about 40 based on a final thickness of unexposed resist of about 7800 angstroms.

The development process of the invention has the advantages of providing a stable developer which permits the achievement of high $S/S_o$ ratios, fast development times, and the use of lower exposure intensities. Because the loss of unexposed resist layer thickness is reduced, the resist provides improved protection for substrates subjected to etching processes in that significantly fewer pin holes are found to occur.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A process for forming a resist mask comprising:
   coating on a substrate a layer of a polymer of a lower alkyl ester of methacrylic acid, wherein the alkyl group contains 1 to 4 carbon atoms, having a molecular weight, $M_w$, of at least about 100,000, which is degradable by high energy radiation of dosage levels above about $1 \times 10^{-6}$ coulombs per square centimeter,
   exposing said layer, patternwise, to a scanning electron beam having an energy of 10 to 50 KV with said exposure providing from 3 to 30 microcoulombs per square centimeter of energy to said layer so as to lower the molecular weight of the polymer in the exposed portions, and
   developing said layer to remove the exposed portion of said layer by immersing said layer in an organic liquid developer, said developer being selected from the group consisting of alkyl acetates and ketones having between 7 and 9 carbon atoms and mixtures thereof, which developer is not a satisfactory developer at ambient temperature, at a temperature of at least about 40° C.

2. The process of claim 1 wherein said polymer is polymethyl methacrylate.

3. The process according to claim 2 wherein said developer is a mixture of n-hexyl acetate and isoamyl acetate in proportion by volume of 8:3 respectively.

4. The process according to claim 2 wherein said developer is a mixture of n-hexyl acetate and 3-heptanone in a proportion by volume of 4:1 respectively.

5. The process according to claim 1 wherein said polymer is polymethyl methacrylate having a weight average molecular weight, $M_w$, of at least about 750,000 and said developer is 3-octanone.

* * * * *